(12) United States Patent
Saito et al.

(10) Patent No.: US 7,006,378 B1
(45) Date of Patent: Feb. 28, 2006

(54) ARRAY ARCHITECTURE AND OPERATION METHODS FOR A NONVOLATILE MEMORY

(75) Inventors: Tomoya Saito, Beacon, NY (US); Tomoko Ogura, Hopewell Jct, NY (US); Kimihiro Satoh, Hopewell Junction, NY (US); Seiki Ogura, Hopewell Jct., NY (US)

(73) Assignee: Halo LSI, Inc., Hillsboro, OR (US)

( * ) Notice: Subject to any disclaimer, the term of this patent is extended or adjusted under 35 U.S.C. 154(b) by 225 days.

(21) Appl. No.: 10/742,987

(22) Filed: Dec. 22, 2003

Related U.S. Application Data (60) Provisional application No. 60/436,131, filed on Dec. 23, 2002.

(51) Int. Cl.
*G11C 16/04* (2006.01)

(52) U.S. Cl. ............................ 365/185.05; 365/185.26; 365/185.24; 257/315; 257/316; 257/319

(58) Field of Classification Search ........... 365/185.05, 365/185.26, 185.24; 257/315, 316, 319
See application file for complete search history.

(56) References Cited

U.S. PATENT DOCUMENTS

| | | | |
|---|---|---|---|
| 6,248,633 B1 | 6/2001 | Ogura et al. | ................. 438/267 |
| 6,469,935 B1 | 10/2002 | Hayashi | .................. 365/185.18 |
| 6,477,088 B1 | 11/2002 | Ogura et al. | ............ 365/185.29 |
| 6,531,732 B1 * | 3/2003 | Sugita et al. | ................ 257/315 |
| 6,650,567 B1 | 11/2003 | Cho et al. | .............. 365/185.17 |
| 6,721,205 B1 * | 4/2004 | Kobayashi et al. | ..... 365/185.26 |
| 2003/0032243 A1 | 2/2003 | Ogwra | ........................ 438/257 |

* cited by examiner

*Primary Examiner*—Richard Elms
*Assistant Examiner*—N. Nguyen
(74) *Attorney, Agent, or Firm*—George O. Saile; Stephen B. Ackerman; Douglas R. Schnabel (57) ABSTRACT

A nonvolatile memory device is achieved. The device comprises a string of MONOS cells connected drain to source. Each MONOS cell comprises a wordline gate overlying a channel region in a substrate. First and second control gates each overlying a channel region in the substrate. The wordline gate channel region is laterally between first and second control gate channel regions. An ONO layer is vertically between the control gates and the substrate. The nitride layer of the ONO layer forms a charge storage site for each control gate. First and second doped regions, forming a source and a drain, are in the substrate. The wordline gate channel region and the control gate channel regions are between the first doped region and the second doped region. First and second transistors connect the topmost MONOS cell to a first bit line and the bottom most MONOS cell to a second bit line.

39 Claims, 8 Drawing Sheets

ARRAY ARCHITECTURE AND OPERATION METHODS FOR A NONVOLATILE MEMORY

This application claims priority to U.S. Provisional Application Ser. No. 60/436,131 filed on Dec. 23, 2002, herein incorporated by reference.

BACKGROUND OF THE INVENTION (1) Field of the Invention

The invention relates to an integrated circuit memory device and, more particularly, to a nonvolatile memory device based on a MONOS cell.

(2) Description of the Prior Art

Memory circuits are a vitally important part of the art of electronic devices. Memory circuits are used to store operating programs and data and are used a wide variety of control and information systems. Memory circuits are typically divided into two main types: volatile and nonvolatile. In a volatile memory, the contents of the memory storage devices are sustained only as long as the power supply to the memory is maintained. In a nonvolatile memory, the data is stored in such a way that the data contents are not lost, even if power is lost.

A typical example of a nonvolatile memory cell is the electrically erasable, programmable read-only memory or EEPROM. An EEPROM device is essentially a modified MOS transistor wherein a charge may be stored on a floating gate structure. The floating gate is constructed in such a way that the presence or absence of charge will cause a large shift in the threshold voltage of the transistor. Further, the floating gate is surrounded by dielectric material such that the charged state of the floating gate is maintained indefinitely regardless of the power supply. The floating gate is typically constructed using a polysilicon layer overlying the circuit substrate with a thin gate oxide therebetween.

Figure 1:
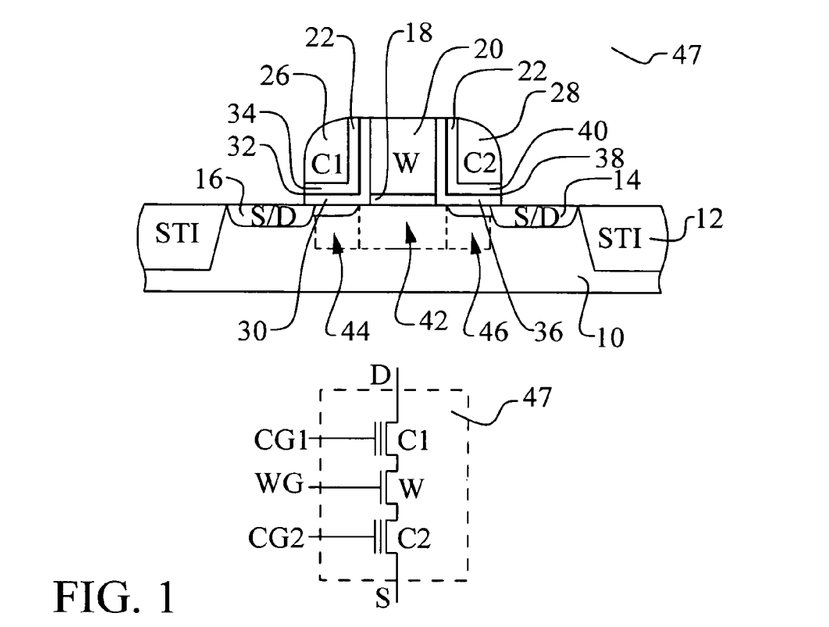
FIG. 1 illustrates a prior art MONOS memory cell in cross sectional representation and in schematic form.

Referring now to FIG. 1, another example of a nonvolatile memory device is shown. This device 47 is called a metal oxide-nitride-oxide silicon, or MONOS cell 47. The exemplary MONOS structure is shown as a simplified cross section and is similar to that disclosed in U.S. Pat. No. 6,248,633 to Ogura et al commonly assigned with the present invention. The MONOS structure 47 comprises a complex MOS gate overlying a substrate 10. The MOS gate comprises a wordline gate 20 and two control gates 26 and 28. The wordline gate 20 comprises a conductive layer 20 overlying the substrate 10 with a gate oxide layer 18 therebetween. The wordline gate 20 controls the wordline channel region 42. The first control gate 26 comprises a conductive layer 26 overlying the substrate 10 with a complex dielectric layer 30, 32, and 34 therebetween. The second control gate 28 comprises a conductive layer 28 overlying the substrate 10 with a complex dielectric layer 36, 38, and 40 therebetween. Each control gate 26 and 28 controls a control gate channel region 44 and 46. In addition, first and second doped regions 14 and 16 form source/drain regions for the MONOS cell 47. The overall cell is arranged such that, if all of the channel regions are ON and a drain-to-source bias is established, then current will flow from the drain 14 to the source 16 (or visa versa depending on the bias) through the first control gate channel region 46, the wordline gate channel region 42, and the second control gate channel region 44.

The threshold voltage of the wordline gate 20 is constant and depends on the doping of the substrate 10 in the wordline gate channel region 42 and on the thickness of the gate oxide layer 18. The threshold voltages of the first control gate 26 and of the second control gate 28 are not constant, however, because of the complex dielectric layers 30, 32, and 34 and 36, 38, and 40, respectively. The first complex dielectric layer 30, 32, and 34 comprises a stack of oxide 30, nitride 32, and oxide 34, or ONO. The second complex dielectric layer 36, 38, and 40 comprises a stack of oxide 36, nitride 38, and oxide 40, or ONO. The ONO stacks act as a dielectric layer during low voltage operation, such as when the cell is in standby mode or is being read. However, during a programming or erasing event, it is possible to cause electrons or holes to move across the oxide layers of the ONO stack such that the nitride layer is charged to a negative or a positive potential. It is possible, for example, to bias the first control gate 26, the source/drain region 16, and the substrate 10 such that charges (electron or hole) will move across either the lower oxide layer 30 or across the upper oxide layer 34 to charge or to discharge the nitride layer 32. Likewise, the second control gate 28, source/drain region 14, and the substrate 10 may be biased such that charges (electron or hole) will move across either the lower oxide layer 36 or across the upper oxide layer 40 to charge or to discharge the nitride layer 38.

If the MONOS cell 47 is formed on a p-type substrate, with n-type source and drain regions 14 and 16, then the threshold voltages for the wordline gate 20 and for the control gates 26 and 28 are typically positive. That is, a large enough positive voltage on any of the gates will invert the underlying channel regions to allow for current flow from drain to source. The threshold voltages of the first and second control gates 26 and 28 will vary with the charged state of the nitride layers 32 and 38 of each of the control gates. These nitride layers 32 and 38 may be thought of as storage sites. If, for example, a negative charge (electron) is stored on the first control gate storage site 32, then the value of the threshold voltage of the first control gate 26 will be larger than if the first control gate storage site 32 is neutrally or positively charged.

The process of storing negative charge on a storage site 32 or 38 of the MONOS cell 47 is called programming. The process of removing this negative charge from the storage site 32 or 38 is called erasing. By this convention, a programmed cell has a larger threshold voltage and an erased cell has a lower threshold voltage. This convention may be reversed such that a cell is programmed by removing negative charge and is erased by storing negative charge.

The MONOS cell 47 is also shown in schematic form. Three transistors, C1, W, and C2 are formed in series between the drain D and the source S. The wordline gate transistor W acts like a normal MOS transistor. The control gate transistors C1 and C2 act like nonvolatile MOS transistors where the charged state of the nitride layer determines the threshold voltage of the device. Each transistor has a gate that is described by its transistor. The wordline gate is designated WG, the first control gate is designated CG1, and the second control gate is designated CG2. It is clear from the schematic that all three transistors CG1, W, and CG2 must be turned ON in order to conduct current from drain D to source S. In addition, the MONOS cell 47 provides two storage sites per cell.

The method of formation of the MONOS cell 47 is described in U.S. Pat. No. 6,248,633 to Ogura et al as referenced above. Of special consideration to the present invention is the formation of the control gates 26 and 28. The control gate layer 26 and 28 is typically a single, conformal layer of polysilicon that is deposited overlying a previously formed wordline gate layer 20. Note that a dielectric layer 22 separates the wordline gate layer 20 from the control gate layer 26 and 28. The control gate layer 26 and 28 is then anisotropically etched down to form spacers on the sidewalls of the wordline gate layer 20 with the dielectric layer 22 therebetween. By forming the control gates 26 and 28 in this fashion, a very compact MONOS cell 47 is fabricated wherein the control gates 26 and 28 are self-aligned to the wordline gate 20 without a photo mask step.

Several prior art inventions relate to nonvolatile memory and, in particular, to MONOS-based memory devices. U.S. Pat. No. 6,248,633 to Ogura et al describes methods to form and to operate a MONOS Memory. A multiple level programming method using ballistic injection is disclosed. U.S. Pat. No. 6,469,935 to Hayashi shows an array architecture for a MONOS-based nonvolatile memory. The bit line array is connected by metal lines such that four memory sites share a single bit line contact. Wordlines and control lines run in first direction while bit lines run in the orthogonal direction. U.S. Pat. No. 6,477,088 to Ogura et al describes methods to program and to erase cells on a twin MONOS array. U.S. Application 2003/0032243 to Ogura et al describes a nonvolatile memory array comprising twin MONOS cells and arranged in a NAND stack. However, the cells do not comprise separate control gates. U.S. Pat. No. 6,650,567 to Cho et al describes a nonvolatile memory comprising floating gate devices in a NAND array.

The above-described prior art MONOS-based memories have several disadvantages. Where a diffusion bit array is used, such as in U.S. Pat. No. 6,248,633 to Ogura et al, the manufacturing process is complex and is not compatible with a standard MOS logic process. Where a metal bit array method is used, such as in U.S. Pat. No. 6,469,935 to Hayashi, the process is simpler because the wordline gates do not need to be cut between cells. However, there is an area penalty associated with the metal bit process because one bit line contact is required for every two memory cells, or every four memory sites. An important purpose of the present invention is to improve the layout density of the MONOS-based memory device.

SUMMARY OF THE INVENTION

A principal object of the present invention is to provide an effective and very manufacturable nonvolatile memory device.

A further object of the present invention is to provide a nonvolatile memory device based on a MONOS cell.

A yet further object of the present invention is to provide a MONOS memory device with high storage density.

A yet further object of the present invention is to provide a MONOS memory device with a NAND architecture.

A yet further object of the present invention is to provide a MONOS memory device with a metal bit structure.

A yet further object of the present invention is to provide a MONOS memory device capable of a variety of programming and erasing schemes.

In accordance with the objects of this invention, a nonvolatile memory device is achieved. The device comprises a string of MONOS cells connected drain to source. Each MONOS cell comprises a wordline gate overlying a channel region in a substrate. First and second control gates each overlying a channel region in the substrate. The wordline gate channel region is laterally between first and second control gate channel regions. An ONO layer is vertically between the control gates and the substrate. The nitride layer of the ONO layer forms a charge storage site for each control gate. First and second doped regions, forming a source and a drain, are in the substrate. The wordline gate channel region and the control gate channel regions are between the first doped region and the second doped region. First and second transistors connect the topmost MONOS cell to a first bit line and the bottom most MONOS cell to a second bit line.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a MONOS memory device. A NAND string of MONOS cells is disclosed. Methods for forming the NAND string with a metal bit layout are disclosed. Methods for reading, erasing, and programming the MONOS architecture are disclosed. It should be clear to those experienced in the art that the present invention can be applied and extended without deviating from the scope of the present invention.

Figure 2:
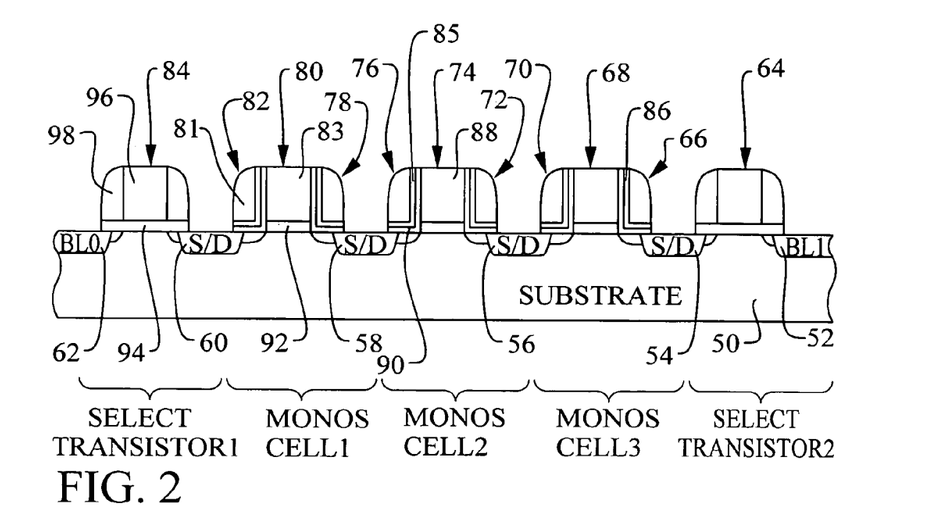
FIG. 2 illustrates a first preferred embodiment of the present invention showing a NAND architecture in cross sectional form.

Referring now to FIG. 2, a first preferred embodiment of the present invention is illustrated. The illustration shows, in cross sectional form, a MONOS based nonvolatile memory device based on a NAND architecture. Several important features of the present invention are shown and discussed below. The NAND MONOS device comprises a string of MONOS cells (CELL1, CELL2, and CELL3) connected drain to source. Each MONOS cell comprises a wordline gate surrounded by two control gates as in the prior art. For example, MONOS CELL1 comprises a first control gate 82, a wordline gate 80, and a second control gate 78. The control gates 82 and 78 comprise a conductive layer 81, such as polysilicon, overlying an ONO layer 90. The wordline gate 80 comprises a conductive layer 83, such as polysilicon, overlying a gate oxide layer 92. The control gate layer 81 is preferably formed by depositing and then etching down the polysilicon layer 81 to form spacers 81 on the sidewalls of the wordline gate layer 83 with a dielectric layer 85 therebetween.

As a key feature of the present invention, the MONOS cells are arranged such that all of the wordline and control gates of all of the MONOS cells must be ON to conductor DC current through any of the cells. This series arrangement is called a NAND architecture. A first select transistor 84 connects the topmost MONOS cell (CELL1) to a first bit line (BL0), and a second select transistor 64 connects the bottom most MONOS cell (CELL2) to a second bit line (BL1). The NAND arranged MONOS cells conduct current from the first bit line BL0 to the second bit line BL1 if all of the MONOS cells and the two selection transistors 64 and 84 are ON.

Figure 3:
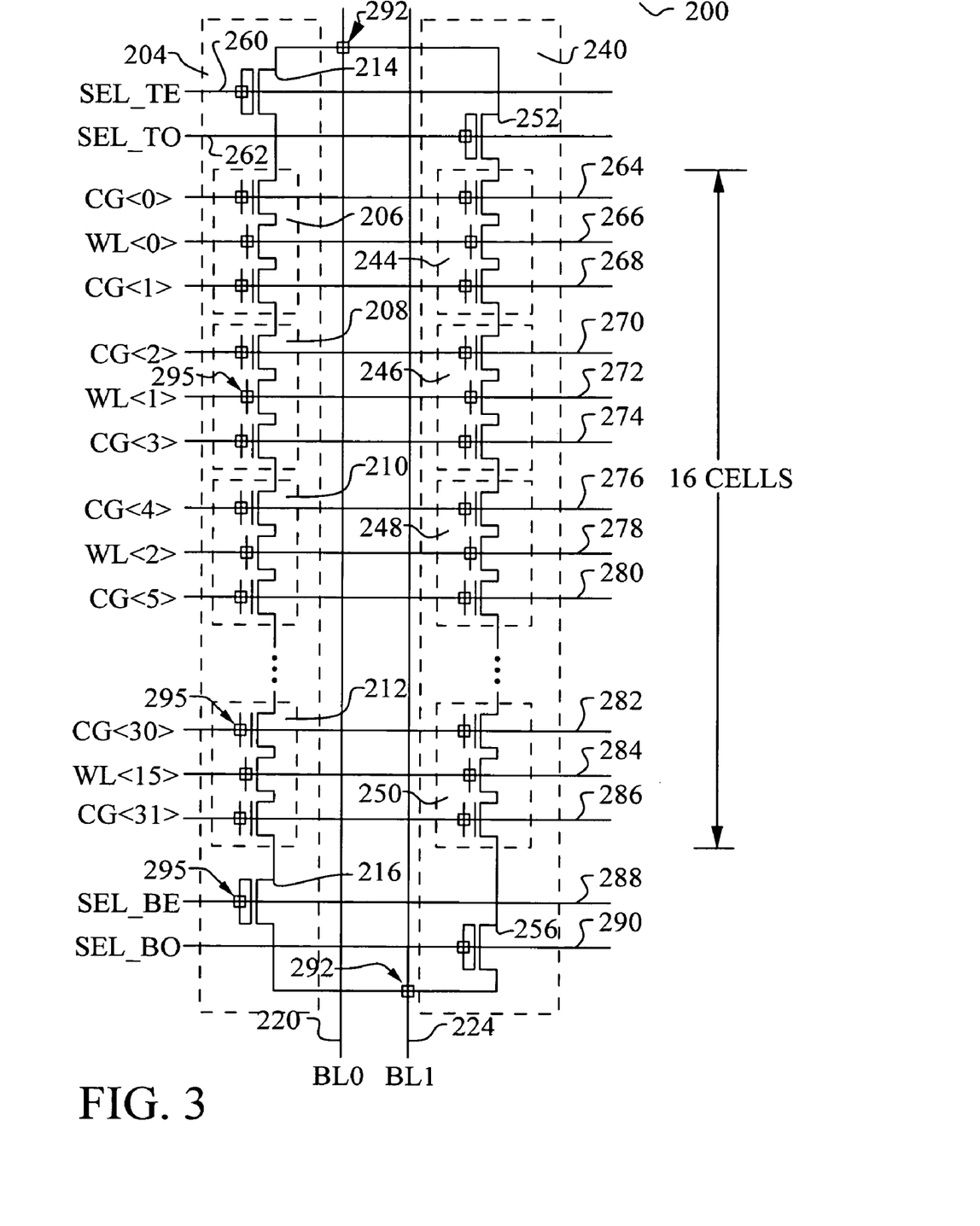
FIG. 3 illustrates the first preferred embodiment of the present invention showing the NAND architecture in schematic form.

Referring now to FIG. 3, the first embodiment of the present invention is illustrated in schematic form. Several important features of the present invention are illustrated. The schematic shows a block 200 of a large nonvolatile memory array comprising NAND strings 204 and 240 of MONOS cells. For example, a first NAND string 204 comprises a first selection transistor 214 connected between the BL0 bitline 220 and the topmost cell 206 of the NAND string 204. A series of MONOS cells 206, 208, and 210, is then connected, drain-to-source, until the bottom most MONOS cell 212 is reached. A second selection transistor 216 is connected between the BL1 bitline 224 and the bottom most cell 212 in the string 204. The NAND array 204 preferably comprises a stack of 16 MONOS cells.

Two NAND strings 204 and 240 are shown in the partial array. The second NAND string 240 is a mirror image of the first string 204 and comprises a top selection transistor 252, a series of MONOS cells 244, 246, 248, and 250, and a bottom selection transistor 256. Note that each NAND string 204 and 240 shares common control gate lines CG<0> 264, CG<1> 268, CG<2> 270, CG<3> 274, CG<4> 276, CG<5> 280, CG<30> 282, and CG<31> 286; and common wordlines WL<0> 266, WL<1> 272, WL<2> 278, and WL<15> 284; and common bit lines BL0 220 and BL1 224. However, each NAND string 204 and 240 is selected by separate selection lines. The first string 204 is the zero, or even, string and is selected by the top even SEL_TE 260 and the bottom even SEL_BE 288 lines. The second string 240 is the one, or odd, string and is selected by the top odd SEL_TO 262 and the bottom odd SEL_BO 290 lines.

Note also that if one string 204 or 240, or chain, is selected, by asserting the selection lines to turn ON the selection transistors, then the other string 204 or 240 is left floating. This is a unique feature of the present invention. In a conventional floating gate NAND memory, it is not possible to float an unselected chain because this would result in too large of a wordline disturbance for the unselected cells and could cause a significant bit error rate. For example, if F-N tunneling is used for programming a typical floating gate EEPROM, then the wordline gate rises to about 20 Volts. However, for the twin MONOS cell device of the present invention, the program and erase voltages are only about 5 Volts and, therefore, the wordline and control gates of the unselected devices experience very little disturbance even if the unselected string is left floating.

Another important feature of the present invention is that the NAND strings 204 and 240 are formed using a metal bit line approach. First, the present invention teaches routing the wordline WL<0>:WL<15> and control line CG<0>: CG<31> signals in a first direction and the bit lines BL0 and BL1 in a second direction that is orthogonal to the first direction. Second, the wordline WL<0>:WL<15> and control line CG<0>:CG<31> signals can be routed across more than one NAND string in a single level comprising the wordline polysilicon and the control gate polysilicon spacers. Third, the selection signals SEL_TE, SEL_TO, SEL_BE, and SEL_BO can be routed across more than one NAND string in a single level comprising polysilicon. Fourth, the bitlines BL0 220 and BL1 224 are routed in metal in the second direction and are contacted down to the source or drain regions of the selection transistors 214, 216, 252, and 256 using simple contacts between metal and diffusion. Fifth, the wordline WL<0>:WL<15> and control line CG<0>:CG<31> signals are contacted using simple metal to polysilicon contacts. As a result, metal lines carrying the wordline WL<0>:WL<15> and control line CG<0>:CG<31> signals can be run in any direction. Finally, sixth, the selection signals SEL_TE, SEL_TO, SEL_BE, and SEL_BO are contacted using simple metal to polysilicon contacts. The resulting NAND string architecture is very dense and is also very compatible with logic MOS processing.

Figure 4:
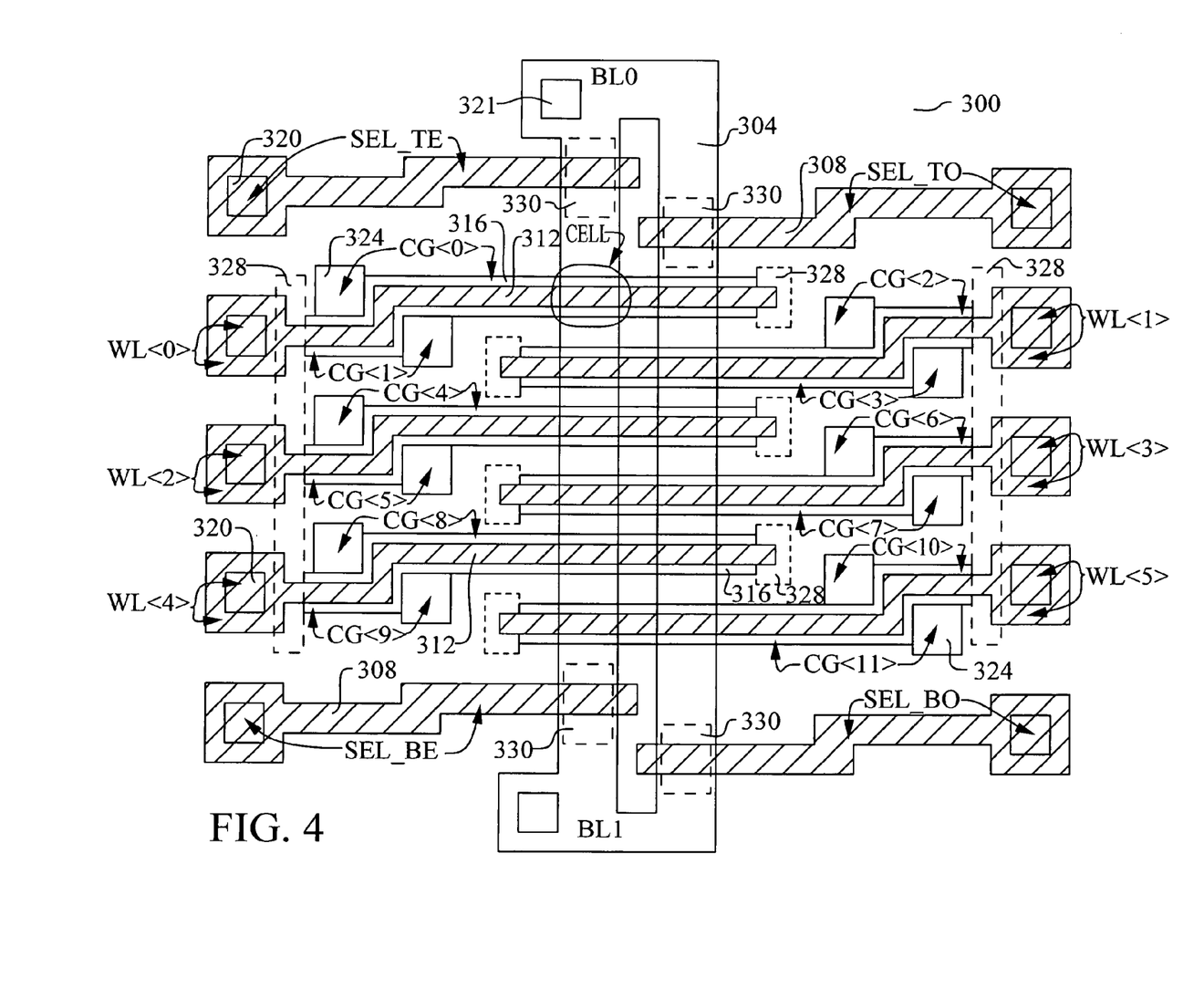
FIG. 4 illustrates a second preferred embodiment of the present invention showing a top layout view of the MONOS NAND architecture.

Referring now to FIG. 4, a top layout view with a second preferred embodiment of the present invention is shown. A partial layout 300 of the MONOS array is shown. The layout 300 shows two NAND strings, each comprising six MONOS cells in series, and the selection transistors. The layout shows the active area 304, the polysilicon layer 308 and 312, the spacer polysilicon layer 316, contacts to active area 321, contacts to polysilicon 320, contacts the spacer polysilicon layer 324, a special spacer mask 328, and diffusion bridges 330. A MONOS cell CELL is circled. A MONOS cell is formed where the polysilicon layer 312 with control gate spacers 316 cross the active area 304. The selection lines SEL_TE, SEL_TO, SEL_BE, and SEL_BO also run in the left to right direction. The MONOS cell active area 304 runs in the top to bottom direction, orthogonal to the wordline gates, control gates, and selection gates.

To achieve a metal bit design, it is necessary to connect the polysilicon lines 308 and 312, the polysilicon spacers 316, and the active area 304 to an overlying metal layer, not shown. This connection is performed using contacts 320, 321, and 324. A tight cell pitch is shown wherein each wordline/control gate combination is closely spaced to its neighbor. Therefore, a unique method of contacting each wordline and control gate line is used. The topmost MONOS cells, having wordline WL<0> and control lines CG<0> and CG<1>, is contacted on the left side. The wordline WL<0> contact 320 is straightforward from metal to polysilicon.

However, to contact the spacer lines 316, two unique features are used. First, a spacer mask 328 is used to disconnect the spacer lines 316 from the wordline 312 that lies between. The spacer polysilicon 316 is removed where the spacer mask 328 defines an opening. Note that the spacer mask 328 is placed at each end of the wordline/control gate line 312 and 316 on each side of the MONOS cells. In this way, the two spacers 316 that are formed on the sidewalls of a single wordline polysilicon line 312 are disconnected from each other. Next, contacts 324 are placed in close proximity to the spacers 316 on each side such that one contact is close to the CG<0> signal side with the other contact is close to the CG<1> side. In this way, a contact to the overlying metal layer, not shown, can be made without shorting to the wordline polysilicon 312.

Next, note that each adjacent wordline/control line 312 and 316 signal route is contacted on the opposite side. That is, the first line, for WL<0>, CG<0> and CG<1>, is contacted on the left side, while the second line, for WL<1>, CG<2> and CG<3>, is contacted on the right side. This pattern is repeated for the length of the NAND string so that contacts for the tight cell pitch are easily made. It is also noted that source/drain regions along odd bit lines on both sides of even selection lines SEL_TE and SEL_BE are bridged together with such as local wiring or implantation under the lines. It is vice versa for even bit lines and odd selection lines.

Figure 5:
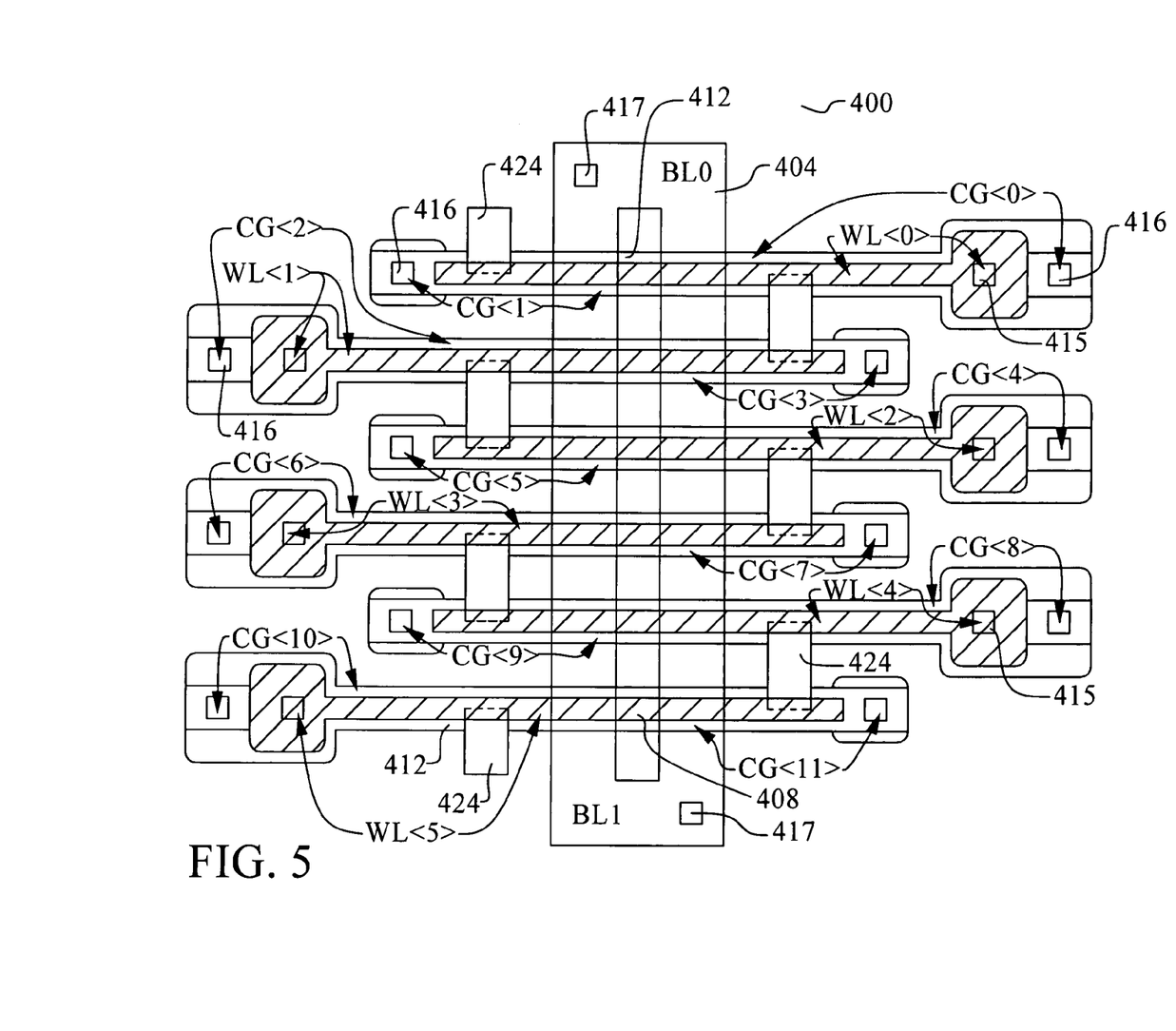
FIG. 5 illustrates a third preferred embodiment of the present invention showing a top layout view of the MONOS NAND architecture.

Referring now to FIG. 5, a third preferred embodiment of the present invention is shown. In this top layout view 400 of the MONOS NAND architecture, the selection transistors are omitted for simplicity of illustration. Again, the layout shows the active area 404, the polysilicon layer 408, the spacer polysilicon layer 412, contacts to active area 417, contacts to polysilicon 415, contacts the spacer polysilicon layer 416, and a special spacer mask 424. In this case, the spacer mask 424 is used to section each control line 416 separately. For example, on the topmost wordline/control line 408 and 412 for WL<0>, CG<0>, and CG<1>, the spacer mask 424 is used to make a cut in the topside spacer layer 412 on the left side of the active area 404 and to make a cut in the bottom side spacer layer 412 on the right side of the active area 404. As a result, the topside of the polysilicon spacer layer 412 as it crosses the active area is the CG<0> signal and the bottom side of the polysilicon spacer layer 412 as it crosses the active area is the CG<1> signal. CG<0> is then connected to the overlying metal layer, not shown, on the right side of the array using the contact 416. CG<1> is then connected to the overlying metal layer, not shown, on the left side of the array using the contact 416. WL<0> is connected to the metal layer, not shown, on the right side of the array using the contact 415. The spacer mask 424 is further shown in the preferred case to cut the top spacer line of on MONOS cell and the bottom spacer line of an adjacent MONOS cell. In addition, the contacts alternate sides such that closely spaced MONOS cells can be formed as in the previous embodiment. However, the layout embodiment shown in FIG. 5 is found to be more robust than that shown in FIG. 4 because it is more forgiving of misalignment tolerance.

Figure 6:
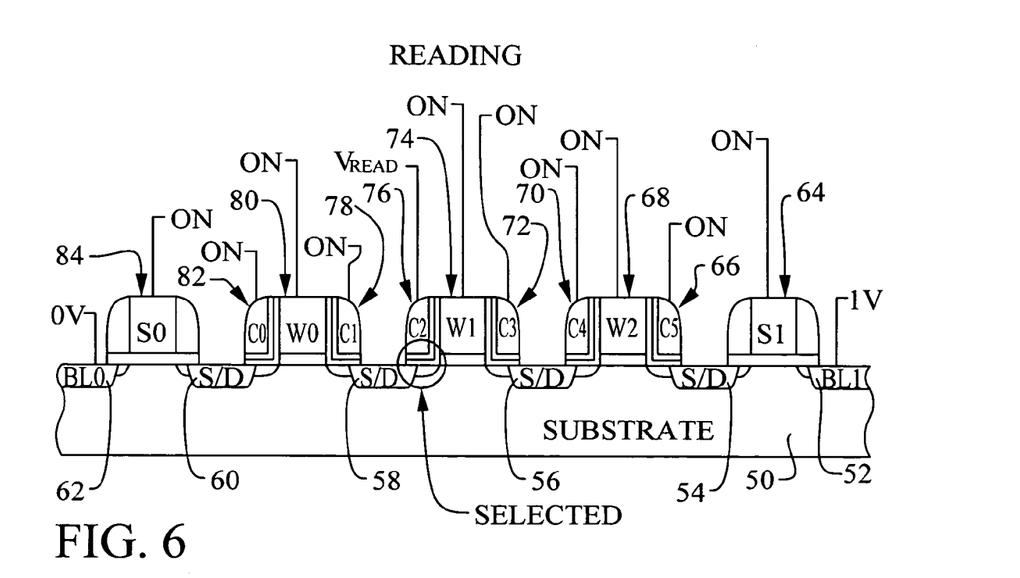
FIG. 6 illustrates a fourth preferred embodiment of the present invention showing a method of reading a MONOS storage site in the NAND architecture.

Referring now to FIGS. 6 through 12, several additional preferred embodiments of the present invention are illustrated. In these preferred embodiments, operation methods specific to the twin MONOS metal-bit NAND array of the present invention are described. Referring in particular to FIG. 6, a fourth preferred embodiment showing a method to determine the state of a selected charge storage site is shown. The first and second transistors 84 and 64 are turned ON to connect the string of MONOS cells to the first and second bit lines BL0 62 and BL1 52. All the wordline gates W0:W2 80, 74, 68 in the string of MONOS cells are turned ON. All the first and second control gates 82, 78, 72, 70, and 66 in the string of MONOS cells are turned ON excepting a selected control gate C2 76 overlying the selected charge storage site. A reading voltage of, for example, between about 1.0 Volts and about 2.0 Volts is forced on the selected control gate C2 76. The reading voltage is above a high state threshold and below a low state threshold for the control gate C2 76 channel region. Current flow is sensed through the first and second bit lines BL0 62 and BL1 52 under a voltage bias of, for example, about 1 Volt, to thereby determine the state of the selected charge storage site.

Figure 7:
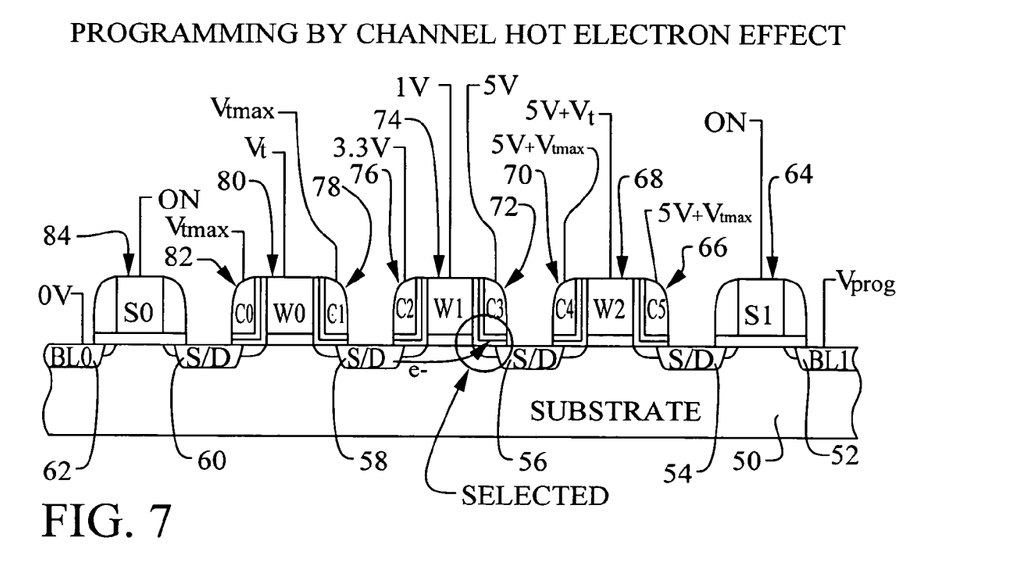
FIG. 7 illustrates a fifth preferred embodiment of the present invention showing a method of programming a MONOS storage site in the NAND architecture by channel hot electron (CHE) effect.

Referring now to FIG. 7, a fifth preferred embodiment of the present invention is illustrated. In this embodiment, a particular storage site is programmed using the channel hot electron (CHE) effect. A high voltage $V_{prog}$ of between about 4 Volts and about 6 Volts is forced between the first and second bit lines BL1 52 and BL0 62. The selected MONOS cell wordline gate W1 is set to a voltage above the threshold voltage of said wordline gate channel region and, more preferably, to about 1 Volts. The control gates C0 82, C1 78, C4, 70, and C5 66 of the non-selected MONOS cells are forced to a voltage above the high state threshold voltage of the control gate channel regions and, more preferably to about 5 Volts above the high state threshold voltage of the control gate channel regions. The selected control gate C3 72 is forced to a voltage above the high state threshold voltage of the control gate channel region and above the voltage forced on said non-selected control gates. More preferably, the selected control gate C3 72 is forced to about 5 Volts. The control gate C2 76 on the override side of the selected MONOS cell is forced to about 3.3 Volts. All the wordline gates W2 68 and control gates C4 70 and C5 66 on the MONOS cells between the selected MONOS cell and the higher voltage bit line BL1 are forced to a voltage of about 5 Volts above the highest threshold voltage of the wordline gate channel regions or of the control gate channel regions. More preferably, the wordline W2 is forced to about 5 Volts above the highest threshold voltage, and the control gate is force to about 5 Volts above the highest threshold voltage. All the wordline gates W0 80 and control gates C0 82 and C1 78 on the MONOS cells between the selected MONOS cell and the lower voltage bit line BL0 62 are forced to a voltage above the highest threshold voltage of the wordline gate channel regions or of the control gate channel regions. As a result, electrons are injected into the nitride region of the selected ONO storage sight by the channel hot electron (CHE) effect.

Figure 8:
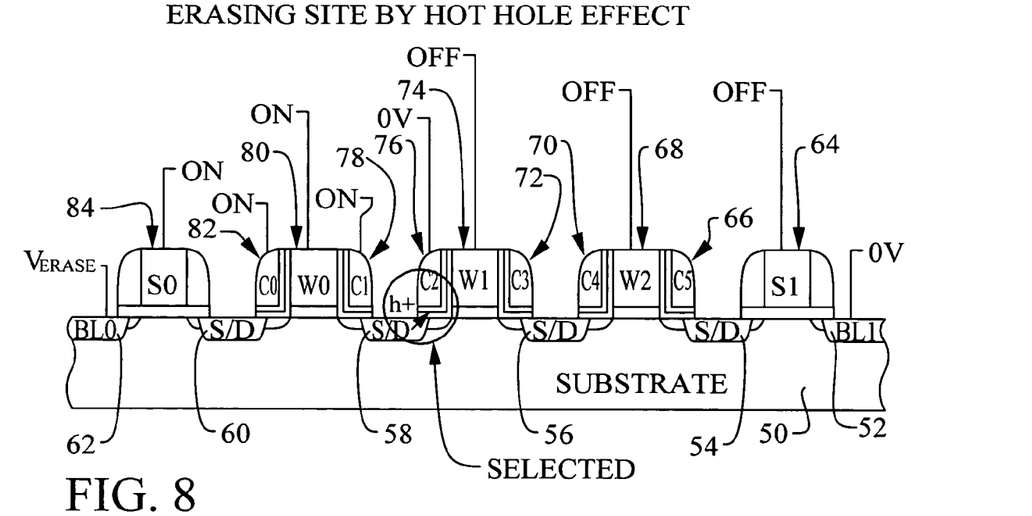
FIG. 8 illustrates a sixth preferred embodiment of the present invention showing a method of erasing a MONOS storage site in the NAND architecture by hot hole effect.

Referring now to FIG. 8, a sixth preferred embodiment of the present invention is illustrated. In this embodiment, a selected site is erased by the hot hole effect. To perform this erase, the wordline gate W1 74 of a selected said MONOS cell is turned OFF. The selected control gate C2 76 is grounded. A positive voltage $V_{erase}$ of between about 4 Volts and about 6 Volts is forced on the doped region 58 at the selected control gate C2 76 such that hole current flows from the doped region 58 to the selected charge storage site by hot hole effect.

Figure 9:
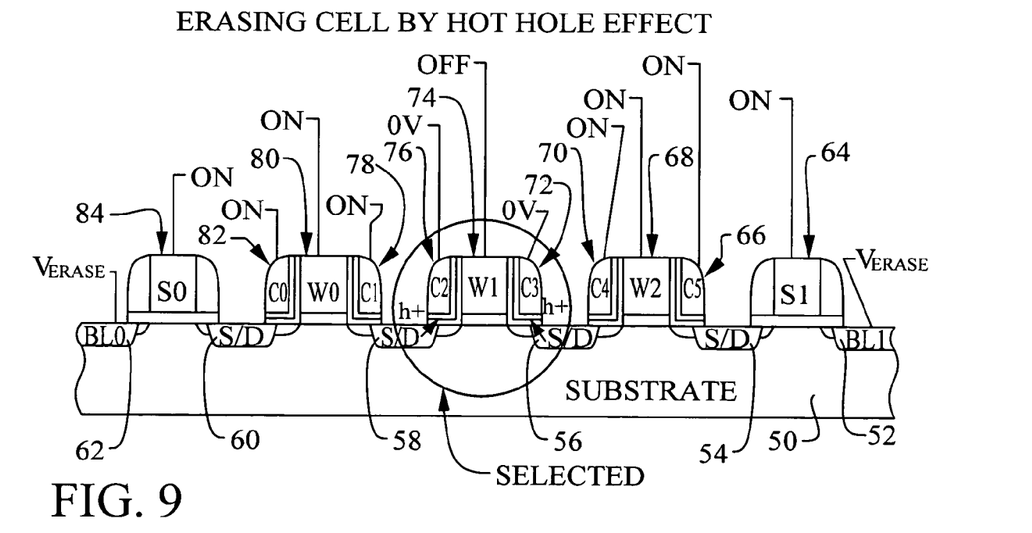
FIG. 9 illustrates a seventh preferred embodiment of the present invention showing a method of erasing both sites of a MONOS storage cell in the NAND architecture by hot hole effect.

Referring now to FIG. 9, as a seventh preferred embodiment, both storage sites of a single MONOS cell can be simultaneously erased by the hot hole effect. In this case, the same conditions are established as in FIG. 8. However, the erase voltage $V_{erase}$ of between about 4 Volts and about 6 Volts is forced on both bit lines BL0 62 and BL1 52. All of the unselected MONOS cells are turned ON such that the erase voltage $V_{erase}$ is presented at each doped region 58 and 56 of the selected MONOS cell.

Figure 10:
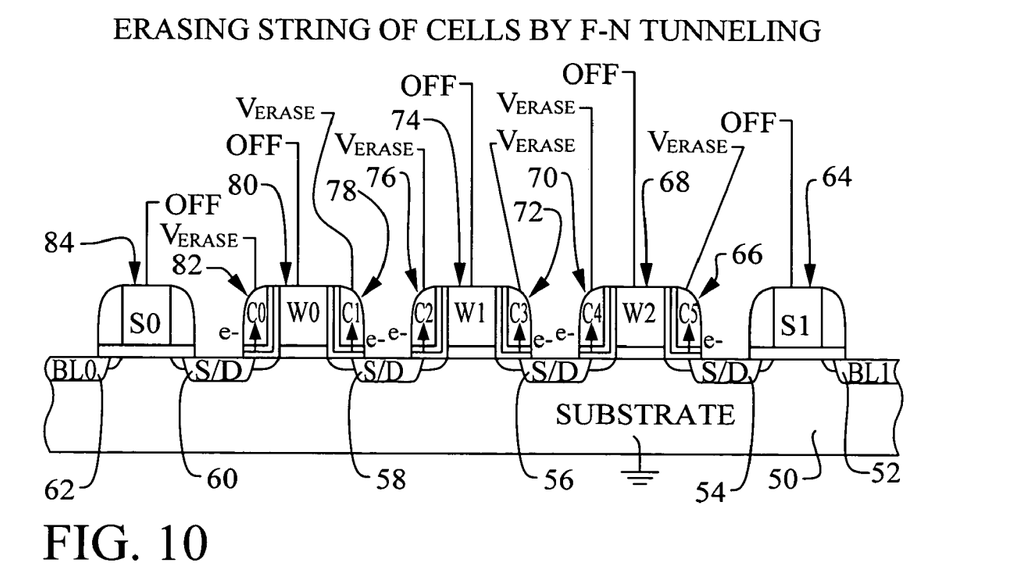
FIG. 10 illustrates a eighth preferred embodiment of the present invention showing a method of erasing all the sites of a string of MONOS storage cells in the NAND architecture by F-N tunneling.

Referring now to FIG. 10, as an eighth preferred embodiment, all of the cells in the NAND string are erased using F-N tunneling. All the wordline gates W0 80, W1 74, and W2 68 of the selected string of MONOS cells are turned OFF. All the control gates C0 82, C1 78, C2 76, C3 72, C4 70, and C5 66 of the selected MONOS cells are forced to a positive voltage $V_{erase}$ of between about 10 Volts and about 12 Volts. The substrate 50 is grounded such that electron current flows from the selected charge storage sites to the control gates by F-N tunneling. Note that, depending on the bias voltages between the channel and the control gate, electrons may escape to the top control gate (referred to as positive erase) or down to the channel/diffusion (referred to a negative erase).

Figure 11:
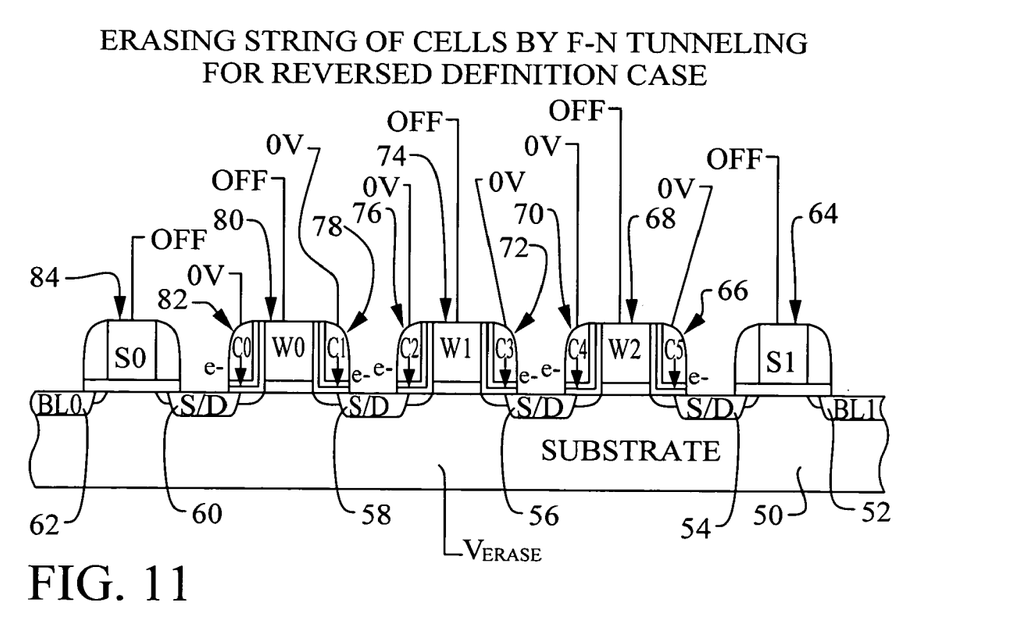
FIG. 11 illustrates a ninth preferred embodiment of the present invention showing a method of erasing all the sites of a string of MONOS storage cells in the NAND architecture by F-N tunneling in a reversed definition case.

Referring now to FIG. 11, a ninth preferred embodiment of the present invention is illustrated. In this embodiment, the sector is erased by F-N tunneling. However, the definition of an erased cell is changed from a low $V_t$ to a high $V_t$, and the definition of a programmed cell is changed from a high $V_t$ to a low Vt. The erasure is performed by turning OFF all the wordline gates W0 80, W1 74, and W2 68 of a selected string of MONOS cells. All the control gates C0 82, C1 78, C2 76, C3 72, C4 70, and C5 66 of the selected MONOS cells are grounded. A positive voltage $V_{erase}$ of between about 10 Volts and about 12 Volts is forced on the substrate 50 such that electron current flows from the selected charge storage sites to the control gates by F-N tunneling. Note that it may be necessary to have a multiple well process to facilitate forcing a positive voltage on the substrate 50.

Figure 12:
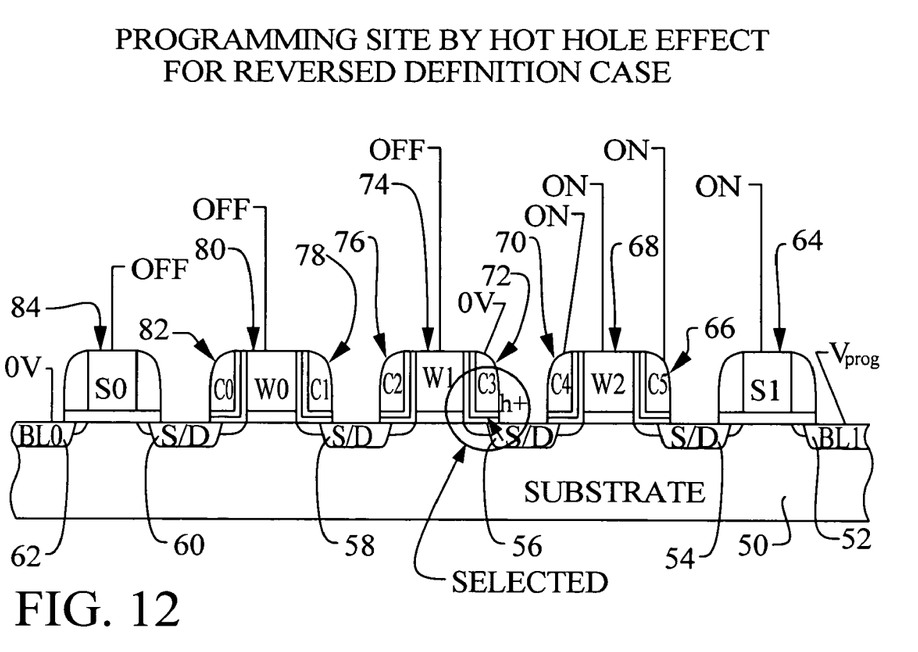
FIG. 12 illustrates a tenth preferred embodiment of the present invention showing a method of programming a site of a MONOS storage cell in the NAND architecture by hot hole effect.

Referring now to FIG. 12, a tenth preferred embodiment of the present invention is shown. Again, the definition of the programmed state is reversed such that a high $V_t$ is the programmed stated rather than a low $V_t$. The wordline gate W1 74 of a selected MONOS cell is turned OFF. The selected control gate C3 72 is grounded. A positive voltage is forced on the doped region 56 at the selected control gate C3 72 such that hole current flows from the doped region 56 to the selected charge storage site by channel hot hole effect.

The advantages of the present invention may now be summarized. An effective and very manufacturable nonvolatile memory device is achieved. The nonvolatile memory device is based on a MONOS cell. The MONOS memory device has a high storage density. The MONOS memory device has a NAND architecture. The MONOS memory device has a metal bit structure. The MONOS memory device is capable of a variety of programming and erasing schemes.

As shown in the preferred embodiments, the novel device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A nonvolatile memory device comprising:
 a string of MONOS cells connected drain to source wherein each said MONOS cell comprises:
  a wordline gate overlying a channel region in a substrate;
  first and second control gates each overlying a channel region in said substrate wherein said wordline gate channel region is laterally between said first and second control gate channel regions, wherein an ONO layer is vertically between said control gates and said substrate, and wherein the nitride layer of said ONO layer forms a charge storage site for each said control gate; and
  first and second doped regions, forming a source and a drain, in said substrate wherein said wordline gate channel region and said control gate channel regions are between said first doped region and said second doped region; and
 first and second transistors connecting topmost said MONOS cell to a first bit line and bottom most said MONOS cell to a second bit line.

2. The device according to claim 1 wherein said control gates comprise spacers formed on the sidewalls of said wordline gates with a dielectric layer therebetween.

3. The device according to claim 2 wherein said control gates are formed by a method comprising:
 providing said wordline gates;
 forming a dielectric layer overlying said wordline gates;
 depositing a polysilicon layer overlying said dielectric layer wherein said ONO layer is between said polysilicon layer and said substrate; and
 etching down said polysilicon layer to form spacers on sidewalls of said wordline gates wherein said spacers form said control gates.

4. The device according to claim 1 further comprising a second said string of MONOS cells and set of said first and second transistors wherein said second set of first and second transistors is connected, in parallel, to said first and second bit lines.

5. The device according to claim 1 wherein each said wordline gate is connected to one of a plurality of wordline signals and wherein said wordline signals are routed to said string of MONOS cells in a metal level.

6. The device according to claim 1 wherein each said control gate is connected to one of a plurality of control line signals and wherein said control line signals are routed to said string of MONOS cells in a metal level.

7. The device according to claim 1 wherein each said wordline gate is connected to one of a plurality of wordline signals, wherein each said control gate is connected to one of a plurality of control line signals and wherein said wordline signals and said control line signals are routed to said string of MONOS cells in a metal level.

8. The device according to claim 7 wherein said wordline signals and said control line signals run in a first direction and said string of MONOS cells runs in a second direction that is orthogonal to said first direction.

9. The device according to claim 7 wherein said control line signals comprise spacers formed on the sidewalls of said wordline signals with a dielectric layer therebetween and wherein said control lines are segmented by a masking and etching process such that a single said wordline signal sidewall comprises two different said control line signals.

10. The device according to claim 1 wherein the state of a selected said charge storage site is determined by a method comprising:
 turning ON said first and second transistors to connect said string of MONOS cells to said first and second bit lines;
 turning ON all said wordline gates in said string of MONOS cells;
 turning ON all said first and second control gates in said string of MONOS cells excepting a selected said control gate overlying a selected said charge storage site;
 forcing a reading voltage on said selected control gate wherein said reading voltage is above a high state threshold and below a low state threshold for said control gate channel region; and
 sensing current flow through said first and second bit lines to thereby determine state of said selected charge storage site.

11. The device according to claim 1 wherein the state of a selected said charge storage site is programmed by a method comprising:
  turning ON said wordline gate of a selected said MONOS cell comprising a selected said control gate overlying a selected said charge storage site;
  turning ON said control gate on the opposite side of said wordline gate from said selected control gate;
  forcing a first positive voltage on said selected control gate;
  forcing a second positive voltage on said doped region at said selected control gate; and
  forcing a low voltage at said doped region at said opposite side control gate such that electron current flows from said doped region at said opposite side to said doped region at said selected control gate and such that a part of said electron current enters said selected charge storage site by channel hot electron effect.

12. The device according to claim 11 wherein said method further comprises:
  forcing a high voltage of between said first and second bit lines;
  forcing said selected MONOS cell wordline gate to a voltage above the threshold voltage of said wordline gate channel region;
  forcing said control gates of non-selected said MONOS cells to a voltage above the high state threshold voltage of said control gate channel regions;
  forcing said selected control gate to a voltage above the high state threshold voltage of said control gate channel region and above said voltage forced on said non-selected control gates;
  forcing all said wordline gates and control gates on said MONOS cells between said selected MONOS cell and the higher voltage said bit line to a voltage of about 5 Volts above the highest threshold voltage of said wordline gate channel regions or of said control gate channel regions; and
  forcing all said wordline gates and control gates on said MONOS cells between said selected MONOS cell and the lower voltage said bit line to a voltage above the highest threshold voltage of said wordline gate channel regions or of said control gate channel regions.

13. The device according to claim 1 wherein the state of a selected said charge storage site is erased by a method comprising:
  turning OFF said wordline gate of a selected said MONOS cell comprising a selected said control gate overlying a selected said charge storage site;
  grounding said selected control gate; and
  forcing a positive voltage on said doped region at said selected control gate such that hole current flows from said doped region to said selected charge storage site by hot hole effect.

14. The device according to claim 1 wherein the states of both said charge storage sites on a selected said MONOS cell are erased by a method comprising:
  turning OFF said wordline gate of a selected said MONOS cell;
  grounding both said control gates of said selected MONOS cell; and
  forcing a positive voltage on said doped regions at said selected control gates such that hole current flows from said doped regions to said selected charge storage sites by hot hole effect.

15. The device according to claim 1 wherein the state of all said charge storage sites on a selected said string of MONOS cells are erased by a method comprising:
  turning OFF all said wordline gates of a selected said string of MONOS cells;
  forcing all said control gates of said selected MONOS cells to a positive voltage; and
  grounding said substrate such that electron current flows from said selected charge storage sites to said control gates by F-N tunneling.

16. The device according to claim 1 wherein the state of all said charge storage sites on a selected said string of MONOS cells are erased by a method comprising:
  turning OFF all said wordline gates of a selected said string of MONOS cells;
  grounding all said control gates of said selected MONOS cells; and
  forcing a positive voltage on said substrate such that electron current flows from said selected charge storage sites to said control gates by F-N tunneling.

17. The device according to claim 1 wherein the state of a selected said charge storage site is programmed by a method comprising:
  turning OFF said wordline gate of a selected said MONOS cell comprising a selected said control gate overlying a selected said charge storage site;
  grounding said selected control gate; and
  forcing a positive voltage on said doped region at said selected control gate such that hole current flows from said doped region to said selected charge storage site by channel hot hole effect.

18. A nonvolatile memory device comprising:
  a string of MONOS cells connected drain to source wherein each said MONOS cell comprises:
    a wordline gate overlying a channel region in a substrate;
    first and second control gates each overlying a channel region in said substrate wherein said wordline gate channel region is laterally between said first and second control gate channel regions, wherein an ONO layer is vertically between said control gates and said substrate, wherein the nitride layer of said ONO layer forms a charge storage site for each said control gate, wherein each said wordline gate is connected to one of a plurality of wordline signals, wherein each said control gate is connected to one of a plurality of control line signals, and wherein said wordline signals and said control line signals are routed to said string of MONOS cells in a metal level; and
  first and second doped regions, forming a source and a drain, in said substrate wherein said wordline gate channel region and said control gate channel regions are between said first doped region and said second doped region; and
  first and second transistors connecting topmost said MONOS cell to a first bit line and bottom most said MONOS cell to a second bit line.

19. The device according to claim 18 wherein said wordline signals and said control line signals run in a first direction and said string of MONOS cells runs in a second direction that is orthogonal to said first direction.

20. The device according to claim 18 wherein said control line signals comprise spacers formed on the sidewalls of said wordline signals with a dielectric layer therebetween and wherein said control lines are segmented by a masking and etching process such that a single said wordline signal sidewall comprises two different said control line signals.

21. The device according to claim 18 wherein said control gates comprise spacers formed on the sidewalls of said wordline gates with a dielectric layer therebetween and wherein said control gates are formed by a method comprising:
  providing said wordline gates;
  forming a dielectric layer overlying said wordline gates;

depositing a polysilicon layer overlying said dielectric layer wherein said ONO layer is between said polysilicon layer and said substrate; and etching down said polysilicon layer to form spacers on sidewalls of said wordline gates wherein said spacers form said control gates.

22. The device according to claim 18 wherein the state of a selected said charge storage site is determined by a method comprising:

turning ON said first and second transistors to connect said string of MONOS cells to said first and second bit lines;

turning ON all said wordline gates in said string of MONOS cells;

turning ON all said first and second control gates in said string of MONOS cells excepting a selected said control gate overlying a selected said charge storage site;

forcing a reading voltage on said selected control gate wherein said reading voltage is above a high state threshold and below a low state threshold for said control gate channel region; and sensing current flow through said first and second bit lines to thereby determine state of said selected charge storage site.

23. The device according to claim 18 wherein the state of a selected said charge storage site is programmed by a method comprising:

turning ON said wordline gate of a selected said MONOS cell comprising a selected said control gate overlying a selected said charge storage site;

turning ON said control gate on the opposite side of said wordline gate from said selected control gate; forcing a first positive voltage on said selected control gate;

forcing a second positive voltage on said doped region at said selected control gate; and forcing a low voltage at said doped region at said opposite side control gate such that electron current flows from said doped region at said opposite side to said doped region at said selected control gate and such that a part of said electron current enters said selected charge storage site by channel hot electron effect.

24. The device according to claim 18 wherein said method further comprises:

forcing a high voltage of between said first and second bit lines;

forcing said selected MONOS cell wordline gate to a voltage above the threshold voltage of said wordline gate channel region;

forcing said control gates of non-selected said MONOS cells to a voltage above the high state threshold voltage of said control gate channel regions;

forcing said selected control gate to a voltage above the high state threshold voltage of said control gate channel region and above said voltage forced on said non-selected control gates;

forcing all said wordline gates and control gates on said MONOS cells between said selected MONOS cell and the higher voltage said bit line to a voltage of about 5 Volts above the highest threshold voltage of said wordline gate channel regions or of said control gate channel regions; and forcing all said wordline gates and control gates on said MONOS cells between said selected MONOS cell and the lower voltage said bit line to a voltage above the highest threshold voltage of said wordline gate channel regions or of said control gate channel regions.

25. The device according to claim 18 wherein the state of a selected said charge storage site is erased by a method comprising:

turning OFF said wordline gate of a selected said MONOS cell comprising a selected said control gate overlying a selected said charge storage site;

grounding said selected control gate; and forcing a positive voltage on said doped region at said selected control gate such that hole current flows from said doped region to said selected charge storage site by hot hole effect.

26. The device according to claim 18 wherein the state of all said charge storage sites on a selected said string of MONOS cells are erased by a method comprising:

turning OFF all said wordline gates of a selected said string of MONOS cells;

forcing all said control gates of said selected MONOS cells to a positive voltage; and grounding said substrate such that electron current flows from said selected charge storage sites to said control gates by F-N tunneling.

27. The device according to claim 18 wherein the state of all said charge storage sites on a selected said string of MONOS cells are erased by a method comprising:

turning OFF all said wordline gates of a selected said string of MONOS cells;

grounding all said control gates of said selected MONOS cells; and forcing a positive voltage on said substrate such that electron current flows from said selected charge storage sites to said control gates by F-N tunneling.

28. The device according to claim 18 wherein the state of a selected said charge storage site is programmed by a method comprising:

turning OFF said wordline gate of a selected said MONOS cell comprising a selected said control gate overlying a selected said charge storage site;

grounding said selected control gate; and forcing a positive voltage on said doped region at said selected control gate such that hole current flows from said doped region to said selected charge storage site by channel hot hole effect.

29. A nonvolatile memory device comprising:

a string of MONOS cells connected drain to source wherein each said MONOS cell comprises:

a wordline gate overlying a channel region in a substrate;

first and second control gates each overlying a channel region in said substrate wherein said wordline gate channel region is laterally between said first and second control gate channel regions, wherein an ONO layer is vertically between said control gates and said substrate, wherein the nitride layer of said ONO layer forms a charge storage site for each said control gate, wherein each said wordline gate is connected to one of a plurality of wordline signals, wherein each said control gate is connected to one of a plurality of control line signals, wherein said wordline signals and said control line signals are routed to said string of MONOS cells in a metal level, wherein said control gates comprise spacers formed on the sidewalls of said wordline gates with a dielectric layer therebetween and wherein said control gates are formed by a method comprising:

providing said wordline gates;

forming a dielectric layer overlying said wordline gates;

depositing a polysilicon layer overlying said dielectric layer wherein said ONO layer is between said polysilicon layer and said substrate; and etching down said polysilicon layer to form spacers on sidewalls of said wordline gates wherein said spacers form said control gates; and first and second doped regions, forming a source and a drain, in said substrate wherein said wordline gate channel region and said control gate channel regions are between said first doped region and said second doped region; and first and second transistors connecting topmost said MONOS cell to a first bit line and bottom most said MONOS cell to a second bit line.

30. The device according to claim 29 wherein said wordline signals and said control line signals run in a first direction and said string of MONOS cells runs in a second direction that is orthogonal to said first direction.

31. The device according to claim 29 wherein said control lines are segmented by a masking and etching process such that a single said wordline signal sidewall comprises two different said control line signals.

32. The device according to claim 29 wherein the state of a selected said charge storage site is determined by a method comprising:

turning ON said first and second transistors to connect said string of MONOS cells to said first and second bit lines;

turning ON all said wordline gates in said string of MONOS cells;

turning ON all said first and second control gates in said string of MONOS cells excepting a selected said control gate overlying a selected said charge storage site;

forcing a reading voltage on said selected control gate wherein said reading voltage is above a high state threshold and below a low state threshold for said control gate channel region; and sensing current flow through said first and second bit lines to thereby determine state of said selected charge storage site.

33. The device according to claim 29 wherein the state of a selected said charge storage site is programmed by a method comprising:

turning ON said wordline gate of a selected said MONOS cell comprising a selected said control gate overlying a selected said charge storage site;

turning ON said control gate on the opposite side of said wordline gate from said selected control gate;

forcing a first positive voltage on said selected control gate;

forcing a second positive voltage on said doped region at said selected control gate; and forcing a low voltage at said doped region at said opposite side control gate such that electron current flows from said doped region at said opposite side to said doped region at said selected control gate and such that a part of said electron current enters said selected charge storage site by channel hot electron effect.

34. The device according to claim 29 wherein said method further comprises:

forcing a high voltage of between said first and second bit lines;

forcing said selected MONOS cell wordline gate to a voltage above the threshold voltage of said wordline gate channel region;

forcing said control gates of non-selected said MONOS cells to a voltage above the high state threshold voltage of said control gate channel regions;

forcing said selected control gate to a voltage above the high state threshold voltage of said control gate channel region and above said voltage forced on said non-selected control gates;

forcing all said wordline gates and control gates on said MONOS cells between said selected MONOS cell and the higher voltage said bit line to a voltage of about 5 Volts above the highest threshold voltage of said wordline gate channel regions or of said control gate channel regions; and forcing all said wordline gates and control gates on said MONOS cells between said selected MONOS cell and the lower voltage said bit line to a voltage above the highest threshold voltage of said wordline gate channel regions or of said control gate channel regions.

35. The device according to claim 29 wherein the state of a selected said charge storage site is erased by a method comprising:

turning OFF said wordline gate of a selected said MONOS cell comprising a selected said control gate overlying a selected said charge storage site;

grounding said selected control gate; and forcing a positive voltage on said doped region at said selected control gate such that hole current flows from said doped region to said selected charge storage site by hot hole effect.

36. The device according to claim 29 wherein the state of all said charge storage sites on a selected said string of MONOS cells are erased by a method comprising:

turning OFF all said wordline gates of a selected said string of MONOS cells;

forcing all said control gates of said selected MONOS cells to a positive voltage; and grounding said substrate such that electron current flows from said selected charge storage sites to said control gates by F-N tunneling.

37. The device according to claim 29 wherein the state of all said charge storage sites on a selected said string of MONOS cells are erased by a method comprising:

turning OFF all said wordline gates of a selected said string of MONOS cells;

grounding all said control gates of said selected MONOS cells; and forcing a positive voltage on said substrate and on said doped regions at said selected control gates such that hole current flows from said substrate and said doped regions to said selected charge storage sites by F-N tunneling.

38. The device according to claim 29 wherein the state of a selected said charge storage site is programmed by a method comprising:

turning OFF said wordline gate of a selected said MONOS cell comprising a selected said control gate overlying a selected said charge storage site;

grounding said selected control gate; and forcing a positive voltage on said doped region at said selected control gate such that hole current flows from said doped region to said selected charge storage site by channel hot hole effect.

39. The device according to claim 29 wherein the state of all said charge storage sites on a selected said string of MONOS cells are erased by a method comprising:

turning OFF all said wordline gates of a selected said string of MONOS cells;

forcing all said control gates of said selected MONOS cells to a positive voltage; and forcing a positive voltage on said substrate such that electron current flows from said selected charge storage sites to said control gates by F-N tunneling.

* * * * *